United States Patent
Bhatt et al.

(10) Patent No.: US 6,207,354 B1
(45) Date of Patent: Mar. 27, 2001

(54) METHOD OF MAKING AN ORGANIC CHIP CARRIER PACKAGE

(75) Inventors: Anilkumar C. Bhatt, Johnson City; Thomas R. Miller, Endwell; Allen F. Moring, Vestal, all of NY (US); James P. Walsh, Vandling, PA (US)

(73) Assignee: International Business Machines Coporation, Armonk, NY (US)

( * ) Notice: Subject to any disclaimer, the term of this patent is extended or adjusted under 35 U.S.C. 154(b) by 0 days.

(21) Appl. No.: 09/288,052

(22) Filed: Apr. 7, 1999

(51) Int. Cl.$^7$ ........................................... G03C 5/00
(52) U.S. Cl. .................... 430/313; 430/319; 430/320
(58) Field of Search ................................ 430/311, 319, 430/320, 313

(56) References Cited

U.S. PATENT DOCUMENTS

| | | |
|---|---|---|
| 4,211,563 | 7/1980 | Goldman . |
| 4,237,210 | 12/1980 | Dougherty . |
| 4,259,421 | 3/1981 | Goldman . |
| 4,773,955 | 9/1988 | Mabuchi et al. . |
| 4,985,601 | 1/1991 | Hagner . |
| 5,022,960 | 6/1991 | Takeyama et al. . |
| 5,048,179 | 9/1991 | Shindo et al. . |
| 5,098,526 | 3/1992 | Bernhardt . |
| 5,102,829 | 4/1992 | Cohn . |
| 5,137,613 | 8/1992 | Burnett et al. . |
| 5,142,448 | 8/1992 | Kober et al. . |
| 5,144,534 | 9/1992 | Kober . |
| 5,175,060 | 12/1992 | Enomoto et al. . |
| 5,209,817 | 5/1993 | Ahmad et al. . |
| 5,285,352 | 2/1994 | Pastore et al. . |
| 5,288,542 | 2/1994 | Cibulsky . |
| 5,397,917 | 3/1995 | Ommen et al. . |
| 5,422,513 | 6/1995 | Marcinkiewicz et al. . |
| 5,542,175 | 8/1996 | Bhatt et al. . |
| 5,566,448 | 10/1996 | Bhatt et al. . |
| 5,599,747 | 2/1997 | Bhatt et al. ........................... 437/209 |
| 5,679,498 * | 10/1997 | Greenwood et al. ................ 430/312 |
| 5,776,662 * | 7/1998 | Shirai et al. ........................... 430/313 |
| 5,953,594 * | 9/1999 | Bhatt et al. ........................... 438/125 |
| 5,985,521 * | 11/1999 | Hirano et al. ......................... 430/314 |

* cited by examiner

Primary Examiner—C. H. Kelly
(74) Attorney, Agent, or Firm—Lawrence R. Fraley

(57) ABSTRACT

A method of making a circuitized substrate wherein a chip-accommodating cavity is formed along with a plurality of conductive elements (e.g., pads, lines, etc.) which form part of the substrate's circuitry. Metallization is provided over the elements and, significantly, on the internal surfaces of the formed cavity to thereby enhance the electrical properties of the finished product, e.g., by assuring a solid, continuous path between upper and lower surfaces of the product.

14 Claims, 13 Drawing Sheets

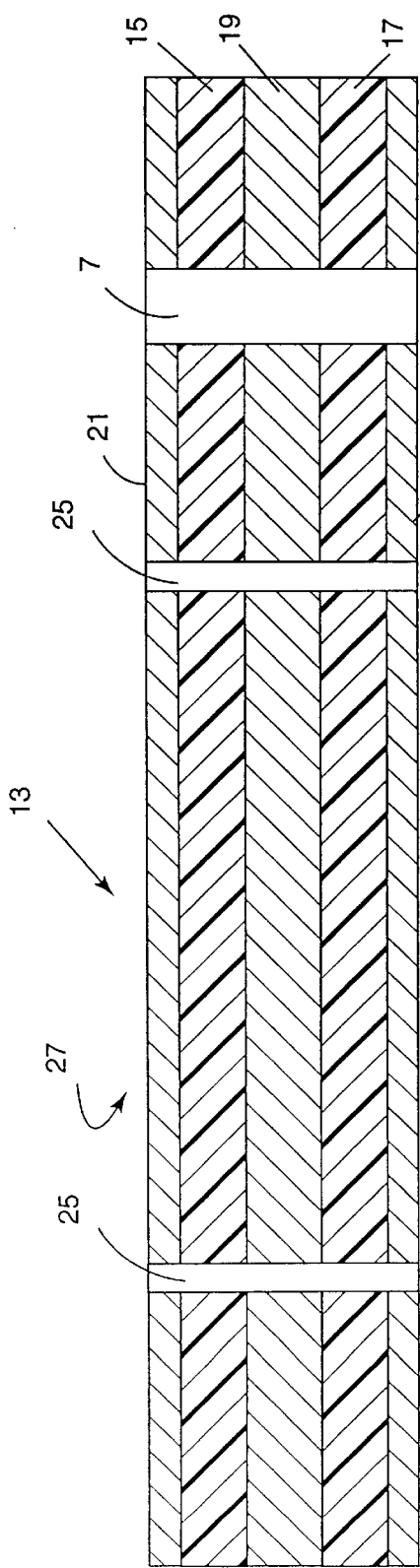
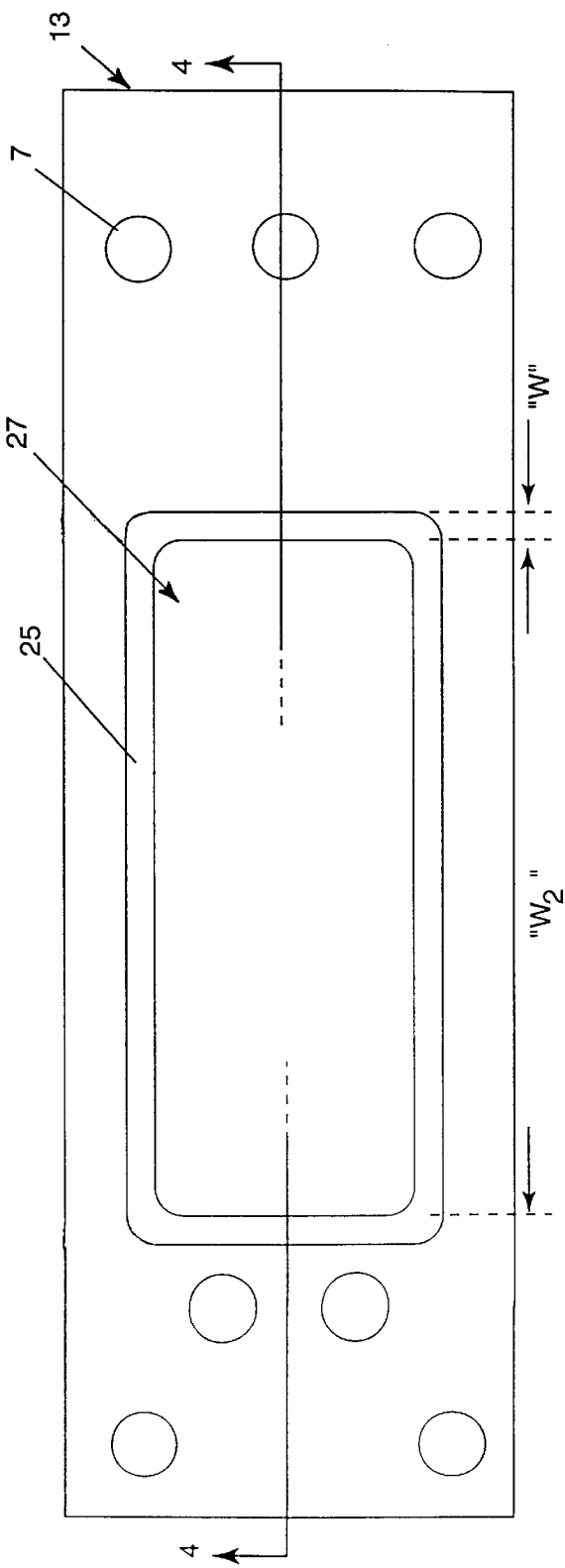

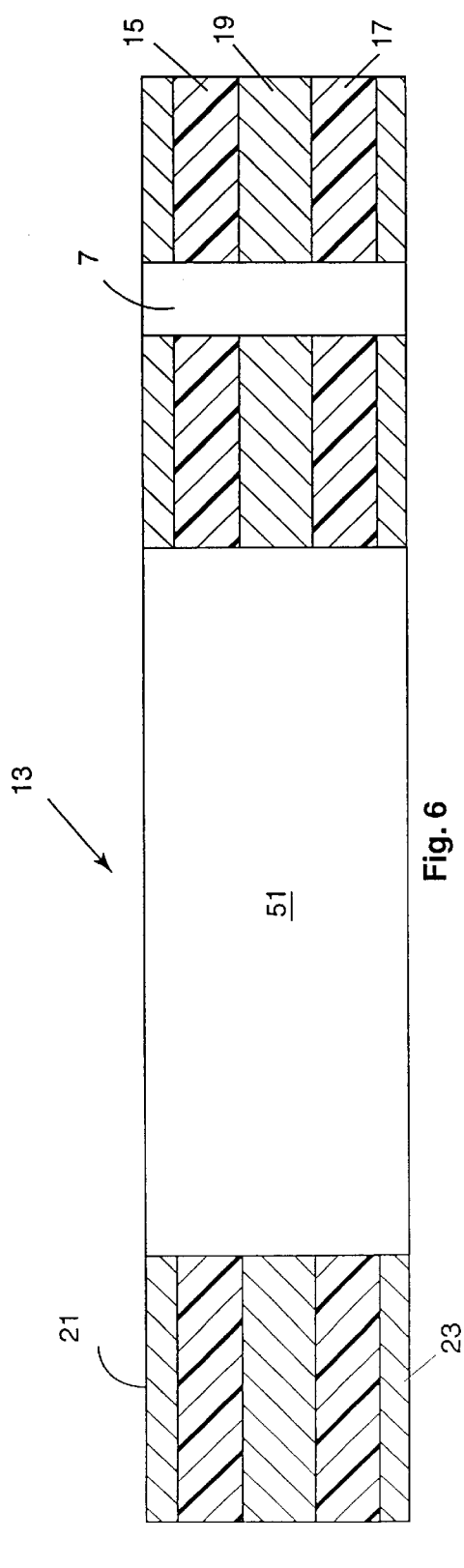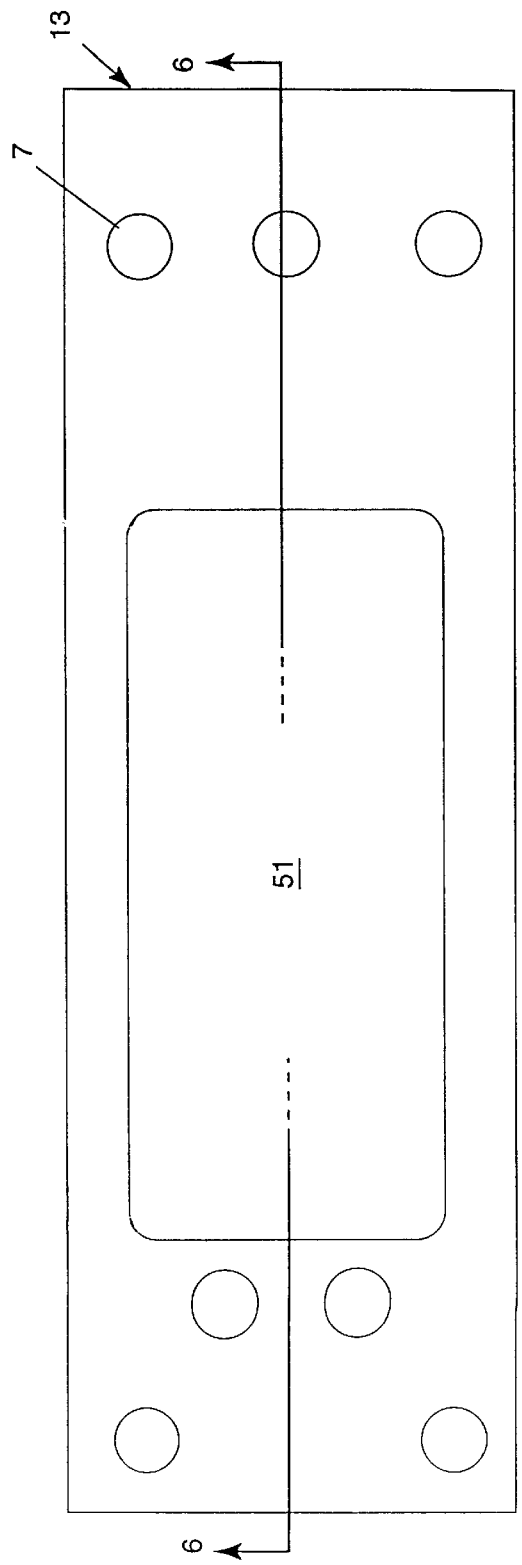

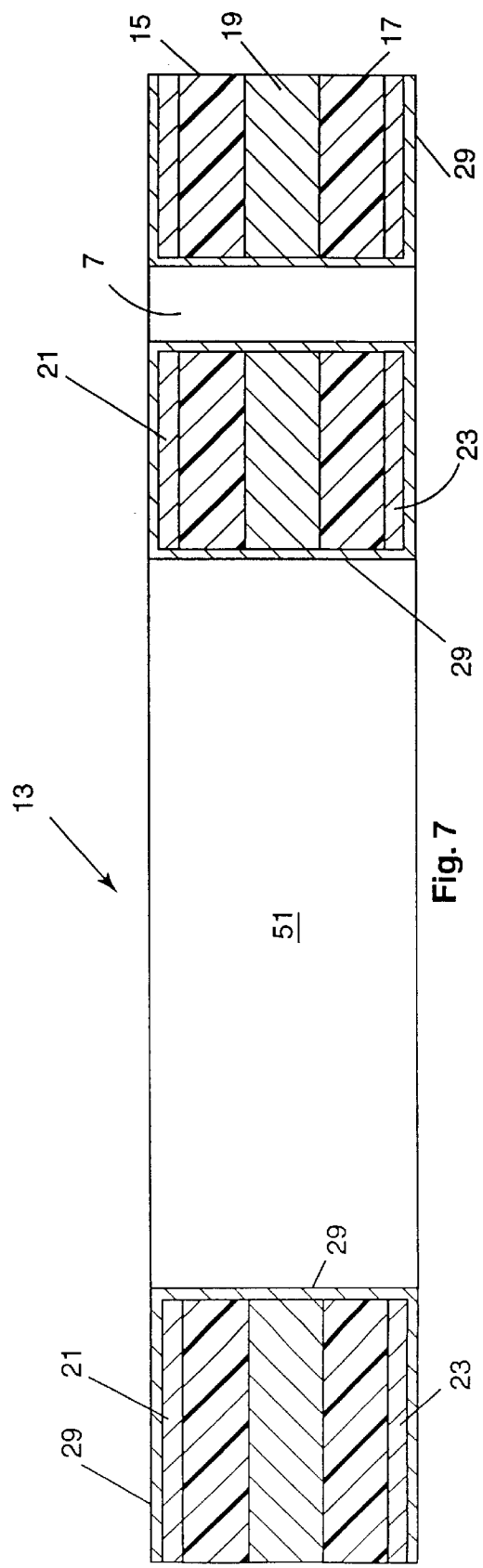

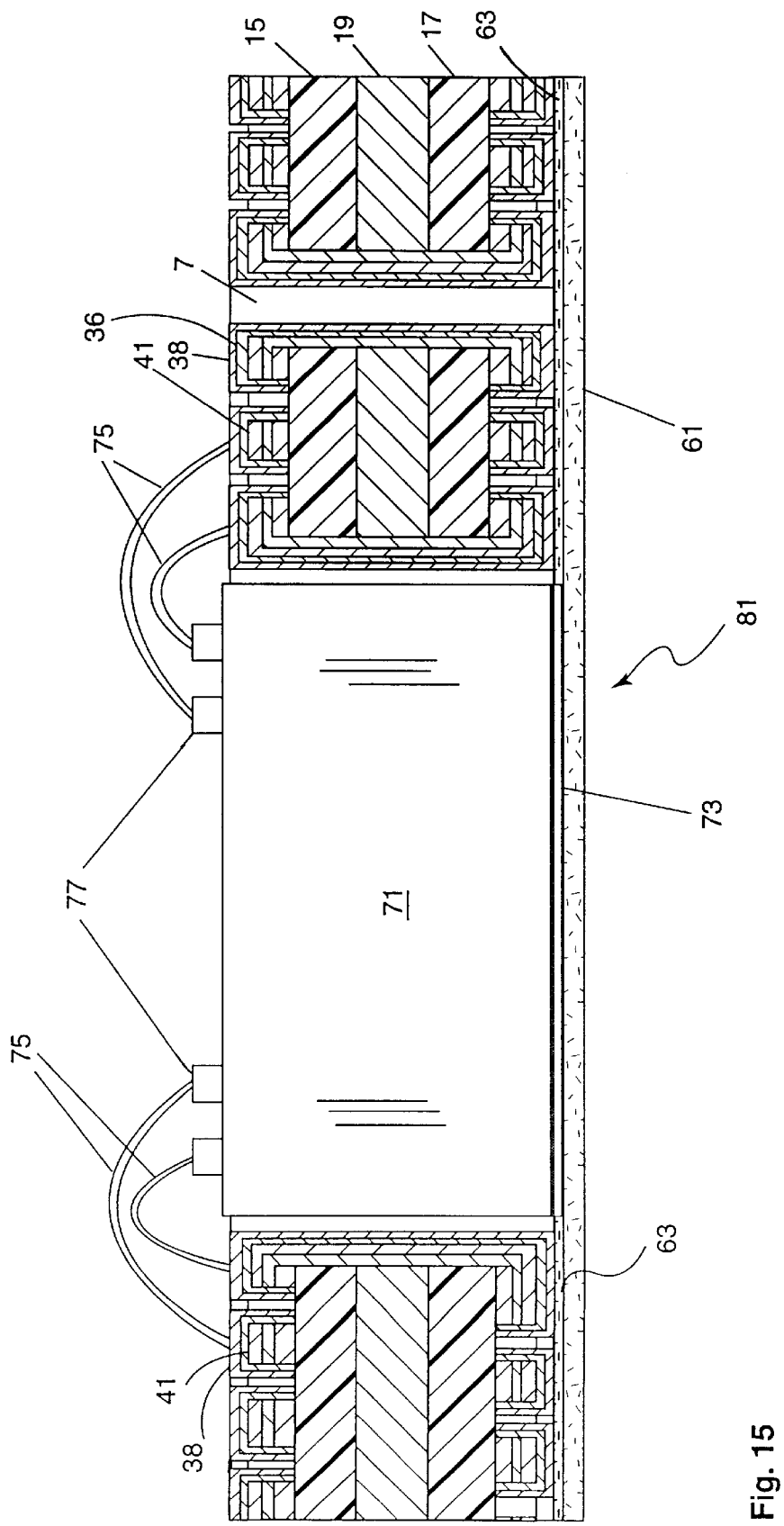

METHOD OF MAKING AN ORGANIC CHIP CARRIER PACKAGE

TECHNICAL FIELD

The invention pertains generally to circuitized substrates and particularly to chip carriers for integrated circuits (semiconductor chips).

CROSS-REFERENCE TO COPENDING APPLICATIONS AND PATENTS

In Ser. No. (S.N.) 08/495,248, now U.S. Pat. No. 5,599,747, entitled "Method Of Making Circuitized Substrate" and filed Jun. 27, 1995, there is defined a process for making a circuitized substrate wherein a temporary support portion is formed and removed, leaving at least of the formed cavity's sidewalls not including metallization thereon following the removal.

In Ser. No. 08/359,491, now U.S. Pat. No. 5,542,175, entitled "Method Of Laminating And Circuitizing Substrates Having Openings Therein" and filed Dec. 20, 1994, there is defined a method of laminating two substrates and circuitizing at least one of these. A plug is provided and shaped to fit within an opening defined in the structure, and then removed following lamination and circuitization.

In Ser. No. 08/390,344, now U.S. Pat. No. 5,798,909, entitled "Organic Chip Carriers For Wire Bond-Type Chips" and filed Feb. 15, 1995, there is defined a chip carrier having a single-tiered cavity within a dual layered (of organic material) substrate and a semiconductor chip located in the cavity. The chip is wire bonded to circuitry on the substrate.

In Ser. No. 08/470,389, now U.S. Pat. No. 5,566,448, entitled "Method Of Construction Of Multi-Tiered Cavities Used In Laminate Carriers", filed Jun. 6, 1995, there is defined a method of forming a chip module wherein a rigid cap and substrate are used, the cap and substrate laminated together with bond pads connected to circuitry disposed in a bottomed cavity of the cap. Following cap circuitization, part of the cap (that over the cavity) is removed and a semiconductor chip coupled to the circuitry.

In Ser. No. 08/820,995, filed Mar. 20, 1997 and entitled "Method Of Making A Circuitized Substrate", there is defined a method of making a circuitized substrate using a removable film layer. Ser. No. 08/820,995 is now U.S. Pat. No. 5,953,594, having issued Sep. 14, 1999.

In Ser. No. 09/042,898, filed Mar. 17, 1998 and entitled "Method Of Making An Enhanced Organic Chip Carrier Package", there is defined another method of making a circuitized substrate using a removable film layer.

It is understood that the presently claimed invention represents an alternative, enhanced version of the methods in Ser. No. 08/820,995 and Ser. No. 09/042,898.

The above pending application and patents are assigned to the same assignee as the present invention. The teachings of these documents are incorporated herein by reference.

BACKGROUND OF THE INVENTION

It is known that integrated circuit devices (hereinafter referred to as semiconductor chips) are typically electronically packaged by mounting one or more chips onto a dielectric, e.g., alumina, circuitized substrate (referred to as a chip carrier), with wire bonds used to electrically connect I/O (input/output) contact pads on each chip to corresponding contact pads (and therefore to corresponding fan-out circuitry) on the circuitized chip carrier substrate. Wire bonding is a well known process in the art and further description is not believed necessary. The resulting chip carrier is then typically mounted on a printed circuit board (PCB) and, using circuitry on the PCB, electrically coupled to other such chip carriers and/or other electronic components mounted on the PCB.

Ceramic chip carrier structures have proven extremely useful in the electronic packaging field. However, the use of ceramic as the dielectric material of the substrate does present certain limitations and drawbacks. For example, the speed of propagation of an electrical signal through a conductive wire located on a dielectric layer (or between two dielectric layers for that matter) is proportional to the inverse of the square root of the dielectric constant of the dielectric material layer or layers. As is known, the dielectric constants of most ceramics are relatively large, e.g., the dielectric constant of alumina (the primary constituent of ceramic materials used in these substrates) is relatively high, which results in ceramic chip carriers exhibiting relatively low signal propagation speeds in comparison to substrates of other (e.g., organic) materials, such as fiberglass-reinforced epoxy resin, polytetrafluoroethylene, etc.

Ceramic chip carrier usage also presents certain input/output (I/O) constraints. For example, a single-layer ceramic chip carrier substrate includes but a single layer of fan-out circuitry on the upper surface of the ceramic substrate, extending to contact pads around the outer periphery of the substrate. A lead frame, having inner leads connected to these peripheral contact pads, is typically used to electrically connect such a ceramic chip carrier to a printed circuit board (PCB). As the number of chip I/Os has increased (in response to more recent enhanced design requirements), it has been necessary to increase the wiring density, sometimes to the point where undesirable cross-talk between adjacent wires may occur. Further, it has become increasingly difficult to form a correspondingly large number of contact pads around the outer periphery of the ceramic substrate. Accordingly, it is understood that single-layer ceramic chip carrier substrates are limited in the ability thereof to accommodate semiconductor chips with significantly increased I/O counts as required in today's packaging designs.

Efforts to accommodate semiconductor chips having relatively large numbers of I/O pads have led to the use of multilayer ceramic chip carrier substrates utilizing what are referred to as "ball grid arrays" (BGAs) in lieu of lead frames. Such multilayer types of ceramic chip carrier substrates differ from single-layer ceramic chip carrier substrates in that these include two or more layers of fan-out circuitry on two or more ceramic layers. Significantly, these layers of fan-out circuitry are electrically interconnected by mechanically drilled holes (called "vias"), which are plated and/or filled with electrically conductive material (e.g., copper). In addition, a certain number of such holes extend from the layers of fan-out circuitry to respective lands on the chip carrier substrates, on which are mounted solder balls (formed in grid arrays, hence the term "ball grid array"). These solder balls are intended to be mechanically and electrically connected to corresponding solderable contact pads on a receiving substrate, e.g., PCB. Unfortunately, the mechanically drilled holes electrically interconnecting the layers of fan-out circuitry have relatively large diameters, requiring the spacing between the fan-out wires to be relatively large. This relatively large spacing between fan-out wires understandably limits the number of chip I/O pads which can be accommodated.

Additional efforts to package chips having a relatively large number of chip I/O pads have led to the use of multi-tiered cavities in multi-layered ceramic substrates. When using such a packaging configuration, a chip is mounted face-up (its I/O pads facing upwardly) at the bottom of a multi-tiered cavity. Wire bonds (e.g., using fine gold wire) are extended from the I/O contact pads on the exposed upper surface of the chip to respective contact pads on the exposed upper surfaces of the different layers of the multi-layered ceramic substrate. While this configuration does make it possible to accommodate a relatively large number of chip I/O pads, it unfortunately typically mandates usage of multiple manufacturing set-up operations to accommodate the different tier height for the relatively long wire bonds extending from the chip to the spaced tiers.

Typically, ceramic chip carrier substrates are also limited in heat dissipation capabilities. For example, in the case of a multilayer ceramic chip carrier having a chip positioned at the bottom of a multi-tiered cavity, heat dissipation is typically achieved by providing a heat sink directly beneath the cavity. This implies, however, that the heat generated by the chip must necessarily be conducted through the ceramic layer at the bottom of the cavity before reaching the heat sink. As a consequence, effective heat dissipation is hampered.

The present invention, as defined herein, teaches an improved method for making a circuitized substrate capable of overcoming the aforementioned drawbacks of other such products. This method is uniquely adaptable for use with many existing manufacturing apparatus (e.g., wire bond and photoimaging equipment) without extensive alteration thereof and can thus be used on a mass production basis to enjoy the benefits thereof.

Different methods for making circuitized substrates are described in U.S. Pat. Nos. 5,022,960 (Takeyama et al), 5,142,448 (Kober et al), 5,144,534 (Kober) and 5,288,542 (Cibulsky et al). In U.S. Pat. No. 5,022,960, a laser beam is used to remove a selected portion of a substrate (12) which eventually accommodates a semiconductor chip (20) positioned on a metal layer (11) also attached to the substrate. In U.S. Pat. No. 5,142,448, there is described the step of compression molding several dielectric layers to form a laminate. Flexibility of certain parts of the board is attained by the provision of slots, and a "plug" is located for occupying the defined flexible region. In U.S. Pat. No. 5,144,534, a method of making rigid-flexible circuit boards is described in which a removable plug is used in the PCB during processing and then removed. And, in U.S. Pat. No. 5,288,542 (assigned to the same assignee as the present invention), another method is described for making a rigid-flexible circuit board in which a release layer (6) is used during processing and subsequently removed.

The above four patents fail to particularly overcome many of the aforementioned difficulties regarding known processes while assuring the higher densities mandated in today's technology.

It is believed, therefore, that a method of making a circuitized substrate which overcomes the above disadvantages and which can be performed in a facile and relatively inexpensive manner would represent a significant advancement in the art. It is further believed that providing such a method which will further enhance one or more of the unique processes defined in the foregoing cited patent applications will also represent a significant art advancement.

As defined herein, such a method will result in a circuitized substrate capable of: (1) exhibiting relatively high electrical signal propagation speeds; (2) accommodating relatively high I/O chips; (3) exhibiting relatively short "time of flight" electrical signal speeds; and (4) exhibiting a relatively high rate of heat dissipation.

DISCLOSURE OF THE INVENTION

It is, therefore, an object of this invention to provide a method of making a circuitized substrate capable of being used as a chip carrier assembly which can be performed in a facile and relatively inexpensive manner in comparison to existing carrier manufacturing processes.

It is a more particular object of the invention to provide such a process which is readily adaptable to existing manufacturing equipment without extensive modification thereof.

In accordance with one aspect of this invention, there is defined a method of making a circuitized substrate comprising providing an electrically insulative base member having first and second opposing surfaces, depositing a first layer of metallization onto each of the first and second opposing surfaces of the base member, removing a selected portion of the base member to form an open cavity therein having sidewalls, and depositing a second layer of metallization onto the first layer of metallization on the first and second surfaces of the base member and onto the sidewalls of the open cavity. A layer of photoimaging material is then deposited onto the second layer of metallization on the first and second opposing surfaces of the base member and the sidewalls, selected portions of the layer of photoimaging material are exposed to define circuit patterns comprised of the first and second layers of metallization on the first and second opposing surfaces, and selected portions of the photoimaging material are removed to expose the circuit patterns on the first and second opposing surfaces while not removing photoimaging material on the sidewalls. The exposed first and second layers of metallization form the circuit patterns on the first and second opposing surfaces. Any remaining photoimaging material on the sidewalls and the second layer of metallization is removed.

BRIEF DESCRIPTION OF THE DRAWINGS

FIGS. 1–15 represent the various steps of making a circuitized substrate in accordance with a preferred embodiment of the invention.

BEST MODE FOR CARRYING OUT THE INVENTION

For a better understanding of the present invention, together with other and further objects, advantages and capabilities thereof, reference is made to the following disclosure and appended claims in connection with the above-described drawings.

As understood from the following, the invention defines a method of making a circuitized substrate and resulting chip carrier wherein the resulting chip carrier is particularly designed to accommodate wire bond-type chips. The carrier produced in accordance with the teachings herein is capable of: (1) exhibiting relatively high electrical signal propagation speeds; (2) accommodating relatively high I/O chips; (3) avoiding the need for multiple manufacturing set-up operations heretofore associated with multi-tiered wire bond packages (as well as achieving a relatively short "time of flight" for electrical signals propagating through the wire bonds); and (4) assuring a relatively high rate of heat dissipation. In particular, the chip carrier produced in accordance with the preferred method taught herein achieves relatively high electrical propagation speeds because it employs organic materials, such as fiberglass-reinforced epoxy resins (in the trade also referred to as "FR4"), polytetrafluorethylene (e.g., Teflon), etc. in lieu of ceramic materials. (Teflon is a trademark of E. I. duPont deNemours and Company.) The resulting chip carrier also accommodates relatively high I/O count chips because it uses at least one organic photoimageable dielectric layer in which photo-vias may be formed to electrically interconnect two (or more) layers of fan-out circuitry. The resulting chip carrier achieves a relatively short "time of flight" for electrical signals propagating through the wire bonds. The invention may further provide enhanced heat sinking for such a structure through the attachment of a sound beat conductor (e.g., copper sheet) to one side of the substrate and placement of the chip (or chips) in thermal contact therewith.

Figure 1:
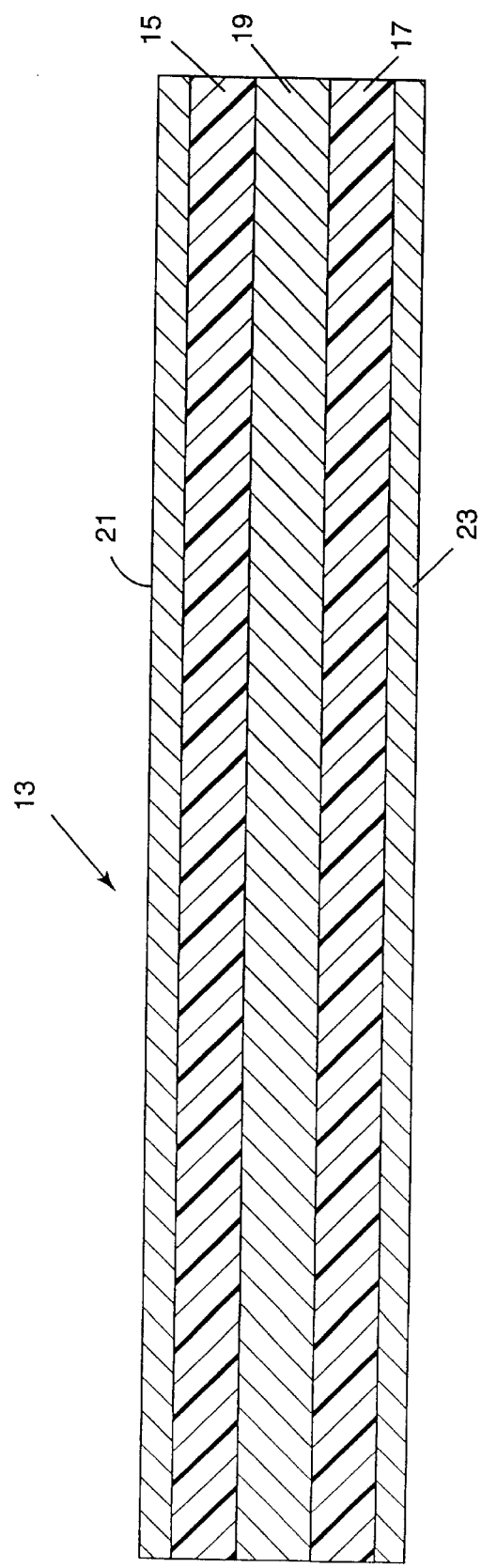

In FIG. 1, there is shown an electrically insulative base member 13 which may be used in the present invention to produce a chip carrier product (described below). It is understood that the invention is not limited to the particular configuration shown in FIG. 1, as others are readily possible. Base member 13 includes first and second dielectric layers 15 and 17 which sandwich therebetween a conductive layer 19. In a preferred embodiment, each of the two dielectric layers is comprised of fiberglass reinforced epoxy resin (often referred to in the industry simply as "FR4") and each possess a thickness of from about 2 mils (thousandths) to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

Conductive layer 19 is preferably of copper or other well-known conductive material and possessing a thickness of preferably within the range of about 0.125 mils to about 2.5 mils. Thicknesses for internal layer 19 of less than 0.125 mils may prove undesirable should the resulting structure be subjected to relatively high temperatures. Additionally, thicknesses greater than 2.5 mils may prove undesirable because of the additional time necessary to form such layers using conventional plating techniques and associated difficulties with line width control. On the outer surfaces of dielectric layers 15 and 17 are located a relatively thin metallic layer (21 and 23, respectively), preferably copper which has a thickness preferably within the range of about 0.1 to 1.0 mils. Layers 21 and 23 are preferably laminated to the outer surfaces of layers 15 and 17. It is now understood that the outer surfaces of layers 21 and 23 represent the outer surface of member 13. Insulative base member 13 is thus understood to include the described, thick dielectric layers in addition to perhaps three separate conductive layers.

The resulting insulative base structure shown in FIG. 1 thus preferably possesses a thickness within the range of only about 4.325 mils to about 44.5 mils. More preferably, a thickness of about 24 mils is used.

Dielectric layers 15 and 17 are bonded to the conductive layer 19 using a lamination process, such a process known in the art and further description is not believed necessary. Although two dielectric layers are shown for base member 13, it is understood that the invention is not limited thereto. Specifically, it is only necessary to provide one such layer while still attaining the advantageous results taught herein. At least two layers are used when it is desired to incorporate an internal conductive (e.g., power, ground or signal) plane for layer 19 as part of the final structure. Understandably, several dielectric layers and corresponding internal conductive layers may be utilized, depending on operational requirements for the finished product.

In FIG. 1, the opposing surface layers 21 and 23 are shown (and have been described) as possibly having a thickness less than internal layer 19. If the invention is to be used for fine line circuitization, it is desired that layers 21 and 23 be as thin as 3 microns. This can be achieved by providing initial layers of much greater thickness and thereafter thinning these to the desired thickness. Such thinning may be accomplished mechanically (e.g., grinding) or by chemical means (e.g., etch). Alternatively, a thin copper foil may simply be adhered to the dielectric's outer surfaces.

Figure 2:
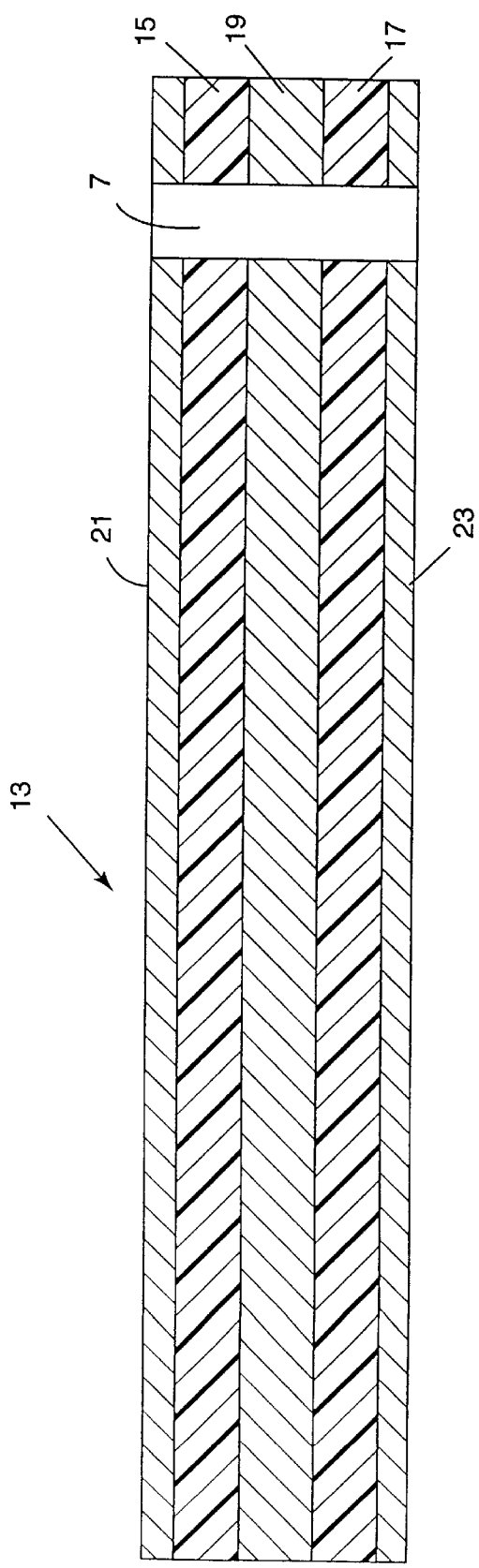

In FIG. 2, a hole 7 is provided (e.g., drilled) through the base member.

FIGS. 3 and 4 illustrate one method for creating the cavity within member 13. A channel 25 created by a routing or profiling machine is made to remove a defined, separate member 27 from member 13. The width ("W") of the channel is only that required to remove member 27. As seen in FIG. 3, the formed channel is a substantially rectangular (preferably square) slot. The size of member 27 is determined by the product application (specifically the size of the semiconductor chip that is to be positioned within the formed cavity). FIG. 3 is a top view of FIG. 4. Member 27 can also be removed through other methods, such as punching. Also shown in FIG. 3 are other drilled holes 7 which may occur in any pattern and may be of similar or different diameters, again, depending on product operational requirements.

FIGS. 5 and 6 show member 27 removed from base member 13, leaving an open cavity 51 that extends entirely through member 13.

Although a substantially rectangular shape is shown for member 27 in the plan views of FIGS. 3 and 5, other shapes (including, e.g., circular) are readily possible, depending on the ultimate chip configuration and the method of coupling this chip to the final product's electrical circuitry. In one example, the resulting opening may possess width and length dimensions each within the range of about 500 to about 700 mils. In a specific example, preferred width and length dimensions each of about 600 mils may be used.

In the next step (FIG. 7), it is preferred to provide a metallized, thin seed layer on the external, exposed surfaces of base member 13, including on the surfaces of cavity 51 and hole(s) 7. As seen in FIG. 7, this thin seed layer 29 material extends through the entire thickness of member 13 at cavity 51. The preferred material for seed layer 29 is palladium. Other metals, e.g., nickel, can be used. Understandably, the described seed layer serves to enhance subsequent positioning of the invention's conductive circuitry (described below). By the term "thin" as used herein is meant a thickness for seed layer 29 within the range of only about 40 to 60 angstroms. Layer 29 may be applied using vapor deposition technique known in the art.

Figure 8:
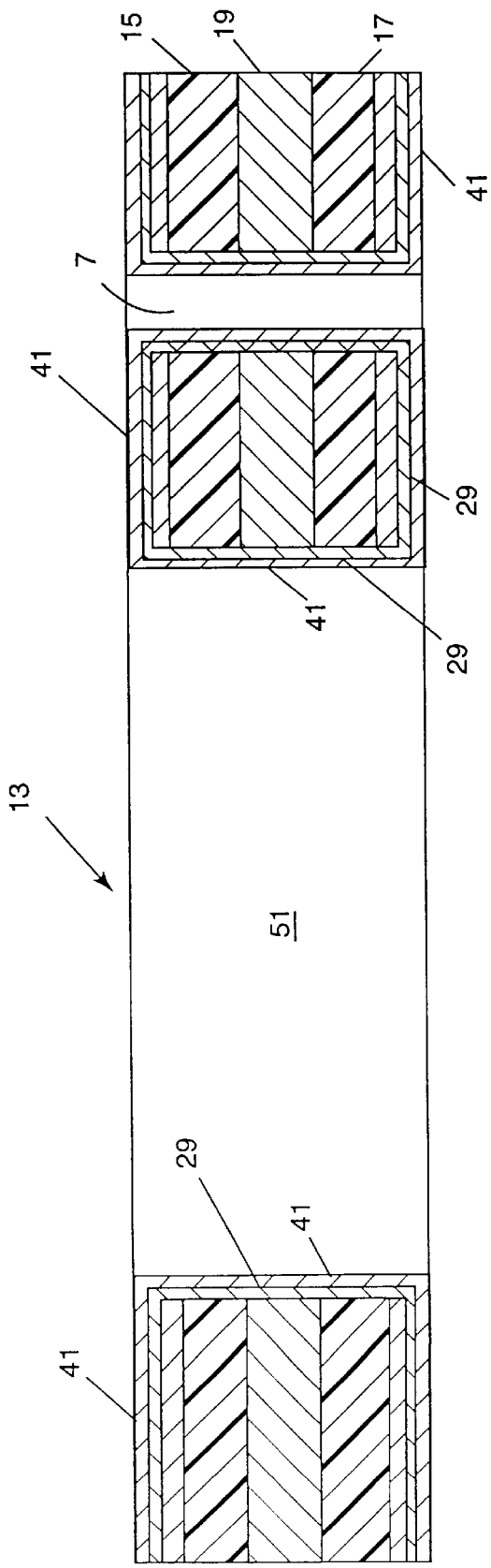

In FIG. 8, base member 13 is shown following a second metallization process wherein a second metal layer 41 (e.g., copper) is deposited on all exposed surfaces of member 13, including within opening 51, and drilled hole(s) 7. The thickness of layer 41 can be about 0.3 to 1.5 mils, this layer being applied utilizing an electroplating process.

Figure 9:
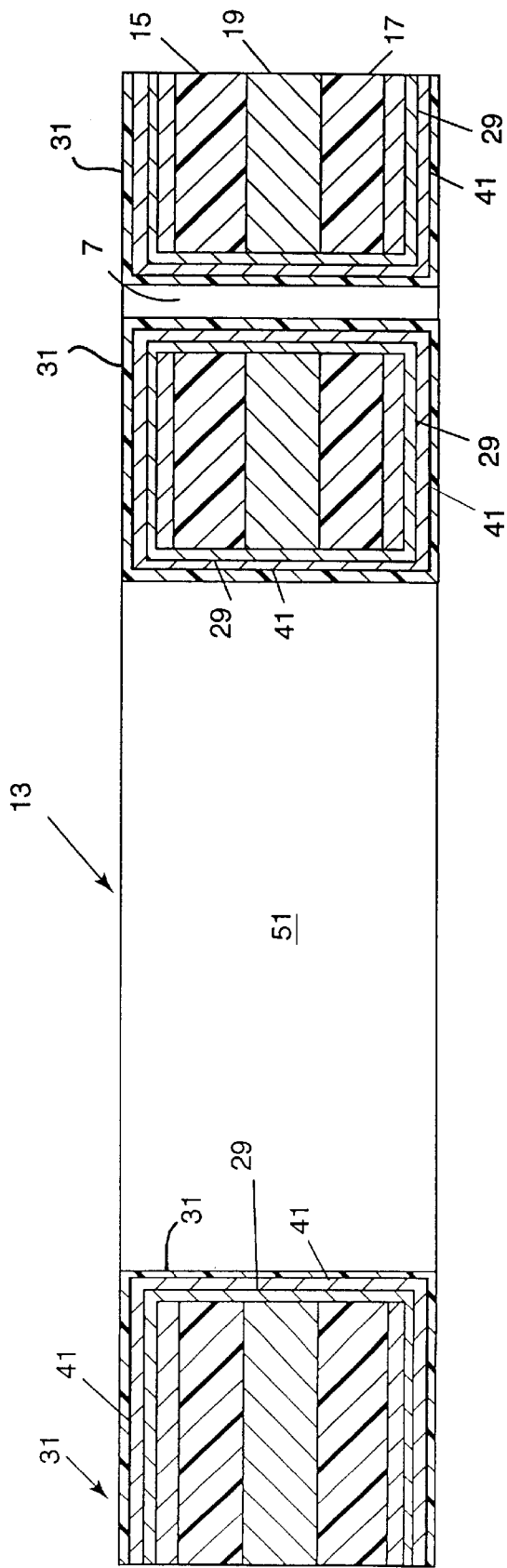

In FIG. 9, a layer of liquid photoresist 31 is applied to all exposed surfaces. This photoresist can be 3–15 microns thick and can be applied by conventional techniques such as electrodepositing. This method involves applying an electrical potential to the substrate. Under this potential, the photoresist forms a thin, uniform layer deposit across the substrate including the walls of the plated through holes. The photoresist is dried prior to exposure.

Exposure of selected portions of the photoresist layer 31 now occurs using standard photolithographic equipment and steps. Following exposure, the resist-coated base member 13 is immersed in an appropriate developing solution (e.g., sodium carbonate, propylene carbonate), which allows the unexposed areas to be removed without excessive impact on the hardened, exposed area. Baking or other processes may be used at this stage to further harden the remaining, exposed portions, if desired.

Figure 10:
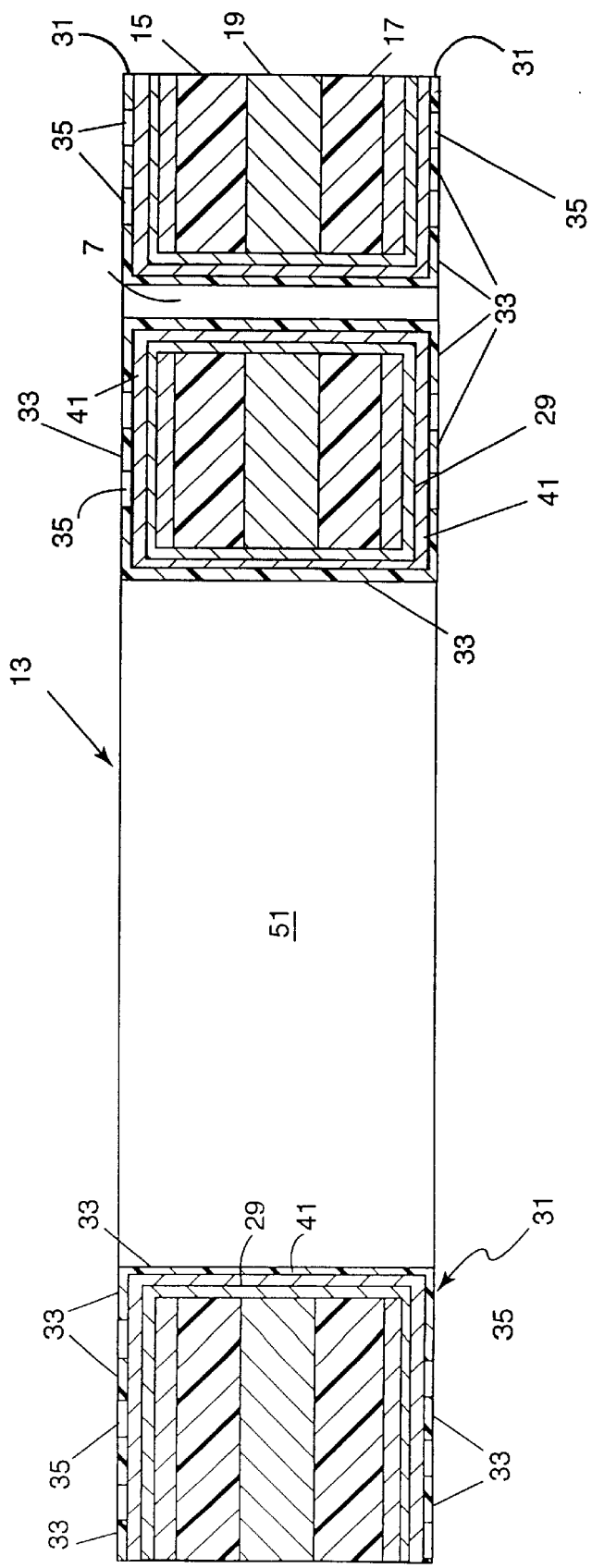

In FIG. 10, base member 13 is shown following the partial photoresist removal (developing) process. As such, only portions of the photoresist layers 31 remain, these portions defining a pattern which will eventually represent the end product's circuitry. These remaining portions of photoresist are represented by the numerals 33, and include the photoresist on the entire external surface of cavity 51 and the internal surfaces of the drilled openings 7. It is understood that the removed portions of the photoresist in turn result in openings (35) which, in turn, expose preselected areas on the respective adjacent surfaces of underlying conductive layer 41. As seen, a predetermined pattern of such exposed areas is provided on the upper and lower opposing surfaces of member 13.

Figure 11:
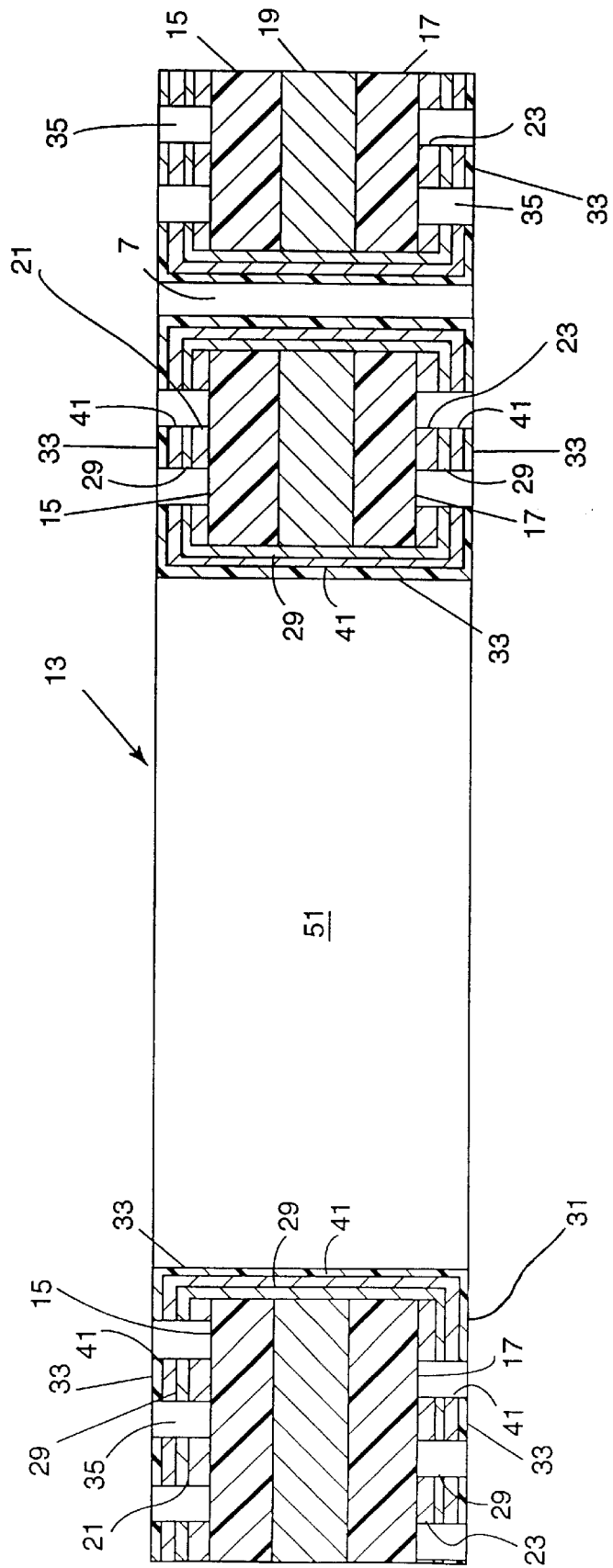

In FIG. 11, member 13 has been subjected to an etching process in which the exposed portions of the two underlying metallization layers, 29 and 41, and original conductive layers 21 and 23, under openings 35, have been etched away. The etching process used may be one known to the industry, such processes using cupric chloride, ferric chloride, etc. Openings 35 are now shown as extending down to the laminate structures 15 and 17.

Figure 12:
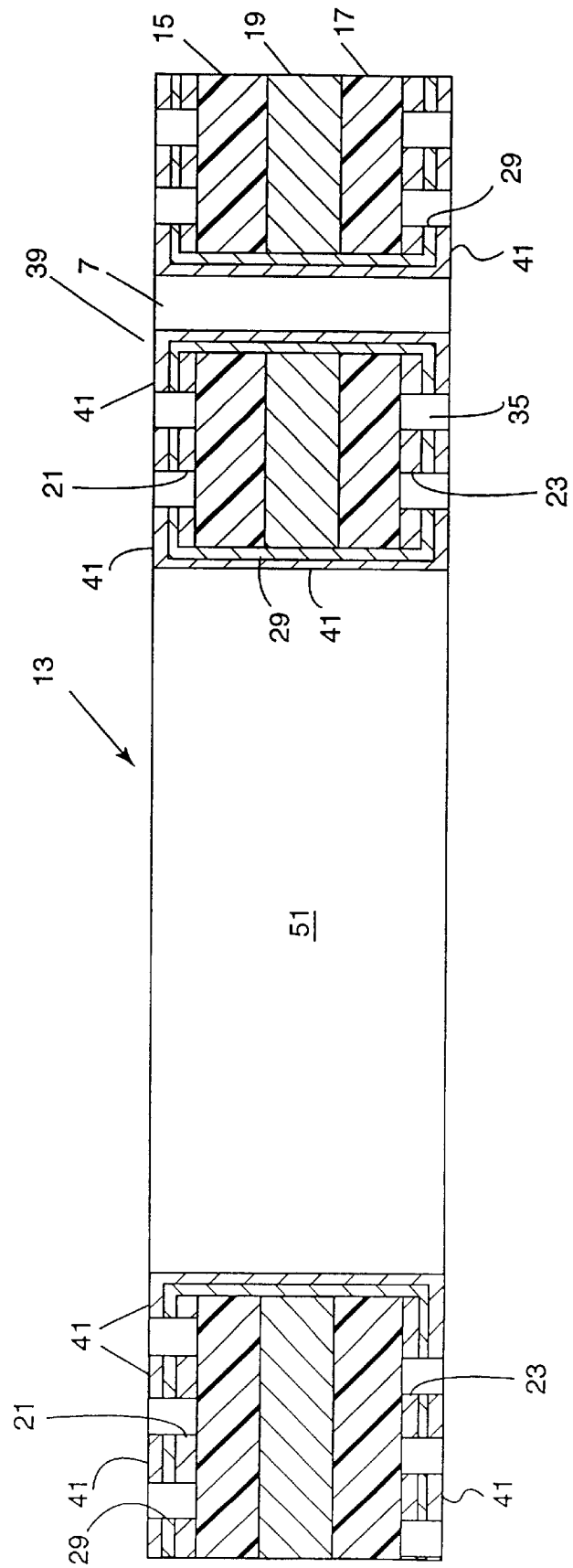

In FIG. 12, the remaining portions 33 of the photoresist layer are removed. A preferred step for doing so is to use a solution similar to the developing solution (e.g., sodium hydroxide, propylene carbonate, benzyl alcohol) but at an elevated temperature compared to the prior developing operation. This solution may be of either an organic or inorganic solvent, depending on the photoresist used. The result is a plurality of conductive elements 41 in the form of lines and/or pads on the outermost, external (upper and lower) surfaces of member 13, these elements substantially surrounding the internal cavity 51 which, as understood, is thus entirely electrically conductive on its outermost surfaces. In one embodiment of the invention, these top and bottom conductive elements may possess a width of only from about 0.5 to 5.00 mils, while it is possible to provide corresponding conductive lines having a length of at least 0.25 mil to 100 mils.

Figure 13:
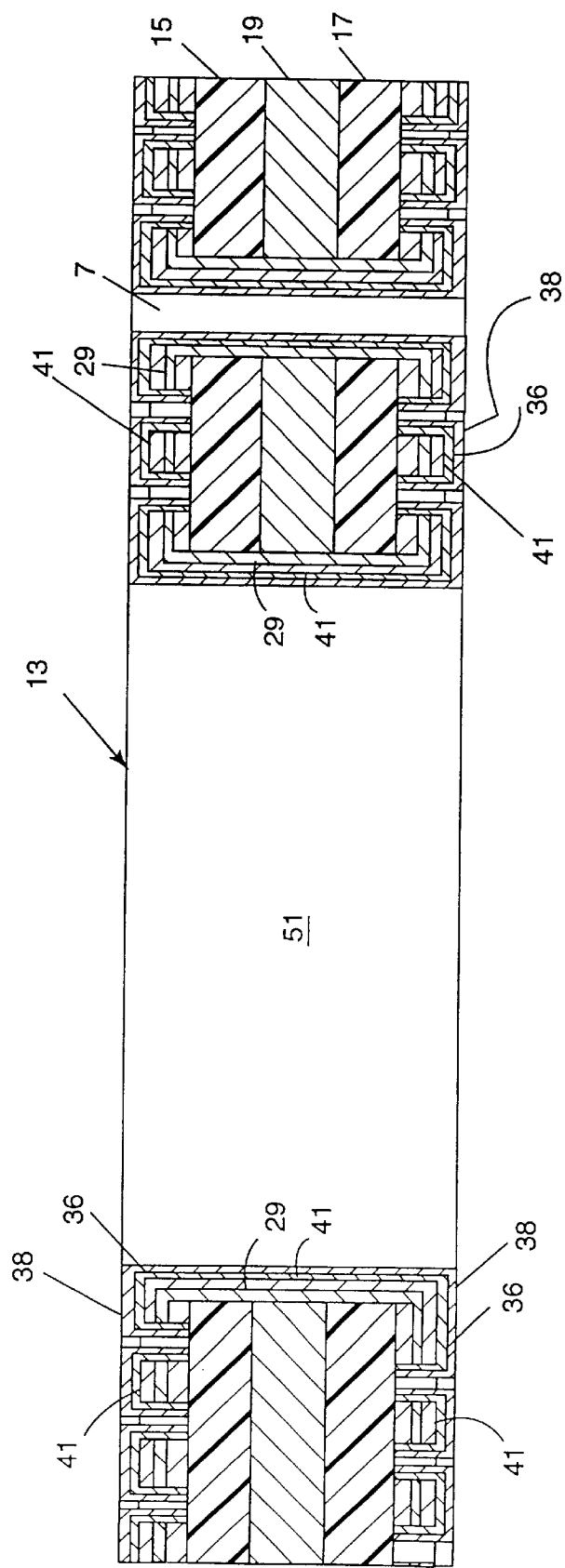

At this point, it may also be desirable to selectively apply a third layer 36 and a fourth layer 38 of metallization in the form of a precious metal (e.g., gold) to various parts of the respective conductive elements formed on the upper and lower surfaces of member 13. See FIG. 13. Other metals for this purpose may include palladium, cobalt, nickel or combinations thereof (including with gold). A desired thickness for the third layer is about 0.05 to 0.25 mils and for the fourth metal layer within the range of only from about 0.04 to about 0.25 mils. Such application is preferably performed by an additive plating process such as described above, a preferred process being electroless plating. Electrolytic plating is also possible. Such additional plating is particularly desired for those surfaces of the circuitry designed to receive the highly conductive, fine wires 75 (FIG. 15) which will eventually couple a semiconductor chip (71, also FIG. 15) to this circuitry. Using suitable masking, it is possible to only selectively plate the invention's outer conductors (those adjacent or surrounding cavity 51) and exclude plating the relatively large cavity opening 51. Although all surfaces are shown in FIGS. 13–15 as having such metal thereon, preferably (for cost reasons) only the upper surfaces of each outer conductor designated to have such wires bonded thereto are covered.

Figure 14:
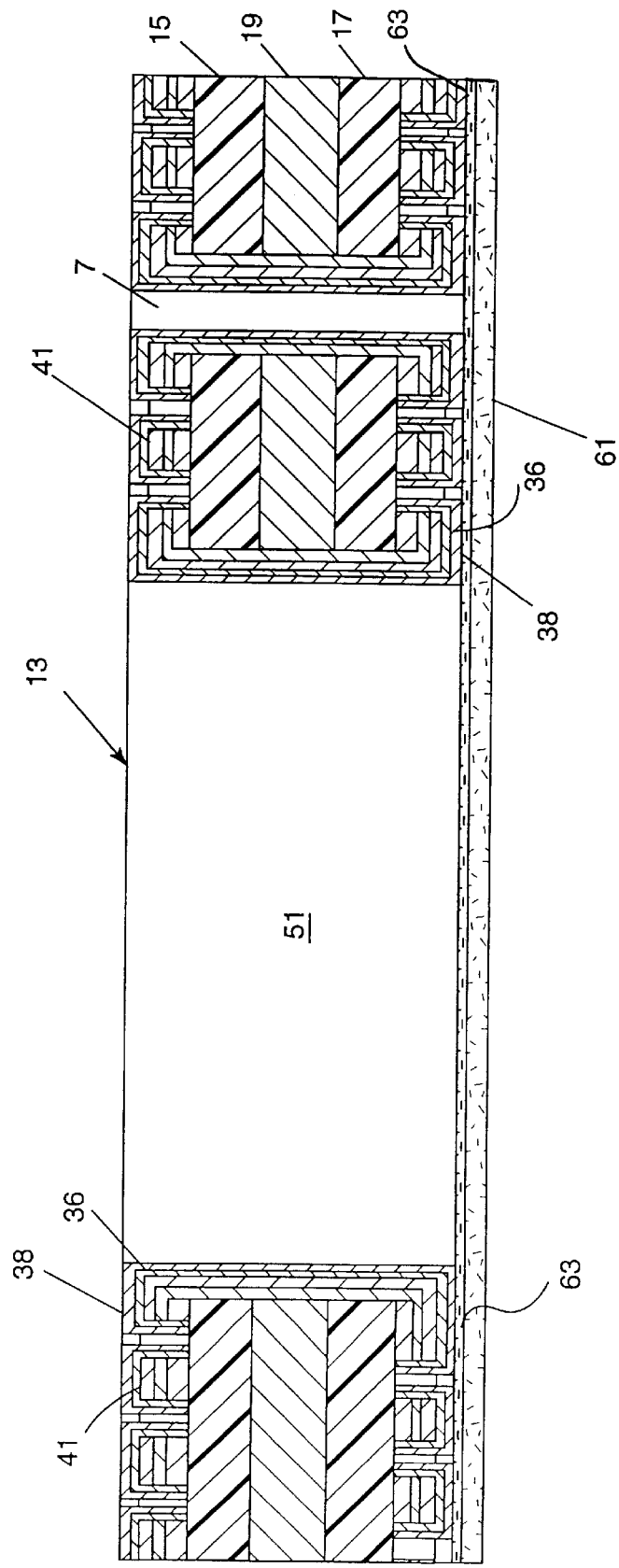

In the event that it is desired to eventually provide a heat sinking and/or stiffening member, such a member, represented by the numeral 61 in FIG. 14, may be simply bonded to the bottom surface (including the respective conductors 41, if present) of member 13. In one embodiment, member 61 may be comprised of a 14 mil thick copper sheet which was secured to member 13 using an epoxy-based adhesive 63. Several adhesives are possible, as are several different metals (e.g., aluminum) for member 61. (Although a second, bottom electrically conductive layer is shown in the embodiments depicted herein, it is understood that, in its broadest aspects, the invention may only utilize a singular (e.g., upper) conductive layer. Should this be the situation, the heat sink and/or stiffener 61 would understandably be directly attached to the lower surface of the bottom dielectric layer 17.) The member 13 in FIG. 14 is now ready to receive the aforementioned integrated circuit (semiconductor) chip 71, such as shown in FIG. 15. Preferably, chip 71 is bonded to the heat sinking and/or stiffening member 61 using a second adhesive 73, a preferred adhesive being of the thermally conducting type which, in a preferred embodiment, is a commercially available silver-impregnated epoxy adhesive sold under the product name Ablebond 9651-L by Ablestick Corporation. Chip 71 is thus thermally coupled to member 61 to assure enhanced heat removal from the final package structure as produced in accordance with the teachings herein. Bond wires 75 (e.g., gold) may now be provided to electrically couple contact sites 77 on the chip's upper surface to corresponding respective ones of the external conductive members 41 (actually to the fourth layer 38 located thereover, if used) which form the upper layer of circuitry for member 13. As seen in FIG. 15, these wires extend from the chip outwardly to this circuitry. The wires 75 are preferably provided using a wirebond process, examples of which are known in the art.

If desired, an encapsulant material (not shown) may be provided over the wires and associated pads to provide protection from the occasionally harsh environment to which the product produced by the invention may be exposed. One suitable encapsulant is an epoxy molding material sold by the Dexter-Hysol Company under the product name Hysol 4450.

FIG. 15 thus illustrates a chip carrier structure 81 which is now capable of being electrically coupled to additional circuit structures (e.g., printed circuit boards) which form part of a larger information handling system (computer) for which the product produced by the invention is particularly suited. One such form of coupling may include solder ball attach in which solder balls (e.g., 90:10 tin:lead) are used to couple respective parts of member 81's circuitry to the circuitry on one/more of such additional circuit structures. Other techniques are of course readily possible for achieving this end.

Thus there has been shown and described a facile method for producing a circuitized substrate for use as part of a chip carrier assembly which is capable of being readily produced using many established processes. The invention thus represents a relatively inexpensive, yet effective process for producing chip carrier structures on a mass scale. While the invention has been described with respect to organic dielectric materials, this is not meant to limit the invention in that even inorganic (e.g., ceramic) may be utilized to provide the dielectric function (layers 15 and 17). As stated above, it is also readily possible to utilize alternative procedures (e.g., subtractive circuitization) which are also known in the art, to accomplish the invention.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

providing an electrically insulative base member having first and second opposing surfaces;

depositing a first layer of metallization onto each of said first and second opposing surfaces of said base member, removing a selected portion of said base member to form an open cavity therein having sidewalls;

depositing a second layer of metallization onto said first layer of metallization on said first and second surfaces of said base member and onto said sidewalls of said open cavity;

depositing a layer of photoimaging material onto said second layer of metallization on said first and second opposing surfaces of said base member and said sidewalls;

exposing selected portions of said layer of photoimaging material to define circuit patterns comprised of said first and second layers of metallization on said first and second opposing surfaces;

removing selected portions of said photoimaging material to expose said circuit patterns on said first and second opposing surfaces while not removing photoimaging material on said sidewalls;

removing said exposed first and second layers of metallization to form said circuit patterns on said first and second opposing surfaces; and substantially removing any remaining photoimaging material on said sidewalls and said second layer of metallization.

2. The method of claim 1 further including the step of depositing a third layer of metallization onto said second layer of metallization.

3. The method of claim 2 wherein said third layer of metallization is deposited using an additive plating process.

4. The method of claim 1 wherein said selected portion of said base member is removed using a process selected from the group of processes consisting of routing, punching and laser ablation.

5. The method of claim 1 wherein said depositing of said first layer of metallization is accomplished using a lamination process.

6. The method of claim 1 wherein said first layer is deposited using an additive plating process.

7. The method of claim 1 wherein said exposing of said selected portions of said photoimaging material is accomplished using a masking process.

8. The method of claim 1 further including securing a heat sinking and/or stiffener member to said base member along said second opposing surface.

9. The method of claim 8 wherein said securing of said heat sinking and/or stiffener member is accomplished using an adhesive.

10. The method of claim 8 further including the step of positioning an integrated circuit member within said open cavity within said base member.

11. The method of claim 10 further including positioning said integrated circuit member on said heat sinking and/or stiffener member.

12. The method of claim 10 further including the step of electrically coupling said integrated circuit member to selected areas of said circuit patterns.

13. The method of claim 12 wherein said electrical coupling is accomplished using a wire bonding process.

14. The method of claim 1 wherein said second layer of metallization is deposited using an additive plating process.

* * * * *